(12) United States Patent
An

(10) Patent No.: US 9,466,372 B2
(45) Date of Patent: Oct. 11, 2016

(54) SEMICONDUCTOR MEMORY DEVICE IMPROVING THRESHOLD VOLTAGE OF UNSELECTED MEMORY BLOCK AND OPERATING METHOD THEREOF

(71) Applicant: SK hynix Inc., Gyeonggi-do (KR)

(72) Inventor: Chi Wook An, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/697,405

(22) Filed: Apr. 27, 2015

(65) Prior Publication Data

US 2016/0148690 A1    May 26, 2016

(30) Foreign Application Priority Data

Nov. 24, 2014    (KR) ........................ 10-2014-0164327

(51) Int. Cl.
*G11C 16/08*    (2006.01)
*G11C 16/04*    (2006.01)
*G11C 16/26*    (2006.01)

(52) U.S. Cl.
CPC ........... *G11C 16/08* (2013.01); *G11C 16/0483* (2013.01); *G11C 16/26* (2013.01)

(58) Field of Classification Search
CPC .... G11C 16/08; G11C 16/26; G11C 16/0483
See application file for complete search history.

(56) References Cited

U.S. PATENT DOCUMENTS

| 6,212,099 B1 * | 4/2001 | Zhang | G11C 16/08 365/185.11 |
| 2006/0133149 A1 * | 6/2006 | Chae | G11C 5/145 365/185.18 |
| 2006/0245251 A1 * | 11/2006 | Shirota | G11C 16/0483 365/185.17 |
| 2008/0049502 A1 * | 2/2008 | Byeon | G11C 16/0483 365/185.05 |
| 2011/0051517 A1 * | 3/2011 | Mui | G11C 11/5628 365/185.17 |
| 2013/0201760 A1 * | 8/2013 | Dong | G11C 11/5642 365/185.17 |
| 2014/0169096 A1 * | 6/2014 | Koo | G11C 16/10 365/185.17 |
| 2014/0233316 A1 * | 8/2014 | Shim | G11C 16/10 365/185.17 |
| 2014/0241069 A1 * | 8/2014 | Kwak | G11C 16/26 365/185.22 |
| 2015/0003169 A1 * | 1/2015 | Nam | G11C 16/26 365/185.25 |
| 2015/0318045 A1 * | 11/2015 | Yun | G11C 16/26 365/185.05 |

FOREIGN PATENT DOCUMENTS

| KR | 1020090108451 | 10/2009 |
| KR | 1020110093088 | 8/2011 |

* cited by examiner

*Primary Examiner* — J. H. Hur
(74) *Attorney, Agent, or Firm* — IP & T Group LLP

(57) ABSTRACT

The present invention relates to a semiconductor memory device and an operating method thereof. The semiconductor memory device may include at least two memory blocks sharing a row decoder, and a peripheral circuit performing a read operation on a selected memory block, between the at least two memory blocks, wherein the peripheral circuit applies a discharge voltage to an unselected memory block, between the at least two memory blocks, for a preset time after a period in which a read voltage is applied to the selected memory block is terminated.

17 Claims, 6 Drawing Sheets

SEMICONDUCTOR MEMORY DEVICE IMPROVING THRESHOLD VOLTAGE OF UNSELECTED MEMORY BLOCK AND OPERATING METHOD THEREOF

CROSS-REFERENCE TO RELATED APPLICATION

The present application claims priority to Korean patent application number 10-2014-0164327, filed on Nov. 24, 2014, the entire disclosure of which is herein incorporated in its entirety by reference.

BACKGROUND

1. Field of Invention

Various exemplary embodiments relate generally to an electronic device, and more particularly, to a semiconductor memory device and an operating method thereof.

2. Description of Related Art

Semiconductor memory devices are typically categorized into volatile memory devices and non-volatile memory devices.

Volatile memory devices operate at high write and read speeds, but they are unable to retain their stored data when their power supply is interrupted. Non-volatile memory devices operate at relatively low write and read speeds, but they may retain the stored data without a constant source of power. Examples of non-volatile memory devices include Read Only Memory (ROM), Mask ROM (MROM), Programmable ROM (PROM), Erasable Programmable ROM (EPROM), Electrically Erasable Programmable ROM (EEPROM), flash memory, Phase-change Random Access Memory (PRAM), Magnetic RAM (MRAM), Resistive RAM (RRAM) and Ferroelectric RAM (FRAM). Flash memories are categorized into NOR and NAND types.

Flash memories have the advantages of both RAM and ROM. For example, flash memories may be freely programmed and erased similar to RAM, and flash memories may retain their stored data even when their power is interrupted, similar to ROM. Flash memories have been widely used as storage media of portable electronic devices such as mobile phones, digital cameras, personal digital assistants (PDAs), and MP3 players.

A semiconductor memory device may include a plurality of memory blocks including a plurality of memory cells. In the semiconductor memory device, two memory blocks may share one row decoder, i.e., an X-decoder. In semiconductor memory devices having this configuration, when a read operation is performed on a selected memory block between two other memory blocks, electron-hole pairs (EHP) may be generated due to a gate-induced-drain-leakage (GIDL) phenomenon between a bit line and a drain selection transistor and between a source line and a source selection transistor, in cell strings included in an unselected memory block. As a result, the width of the memory cell threshold voltage distribution of the unselected memory block may increase.

SUMMARY

An embodiment is directed to a semiconductor memory device capable of improving the threshold voltage distribution of an unselected memory block of at least two memory blocks sharing a single row decoder during a read operation of the semiconductor, and an operating method thereof.

A semiconductor memory device according to an embodiment of the present invention may include at least two memory blocks suitable for sharing a row decoder, and a peripheral circuit suitable for performing a read operation on a selected memory block of the at least two memory blocks, wherein the peripheral circuit applies a discharge voltage to an unselected memory block of the at least two memory blocks for a preset time after a period in which a read voltage is applied to the selected memory block is terminated.

A semiconductor memory device according to an embodiment of the present invention may include an address decoder including a plurality of row decoders, at least two memory blocks corresponding to one of the plurality of row decoders, and a voltage generator suitable for generating and outputting a read voltage, a pass voltage and a discharge voltage to the address decoder, wherein the address decoder applies the read voltage to a selected memory block of the at least two memory blocks, and applies the discharge voltage to the unselected memory block during a read operation.

An operating method of a semiconductor memory device including at least two memory blocks sharing a row decoder, the operating method comprising: applying a read voltage to a selected memory block of the at least two memory blocks, and applying a discharge voltage to an unselected memory block after applying the read voltage to the selected memory block.

DETAILED DESCRIPTION

Figure 1:
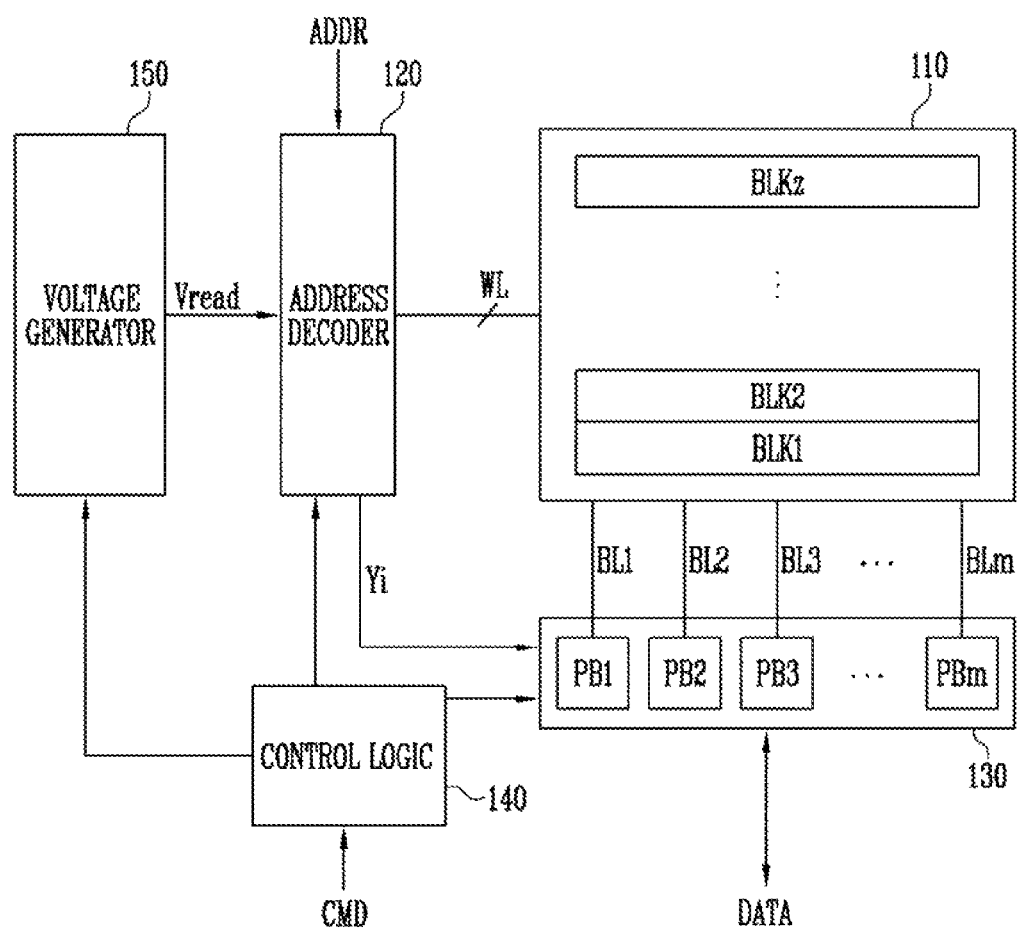
FIG. 1 is a block diagram illustrating a semiconductor memory device according to an embodiment.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness of explanation. Like reference numerals refer to like elements throughout the specification and drawings.

Furthermore, 'connected/coupled' represents that one component is directly electrically coupled to another component or indirectly electrically coupled through another component. A singular form may include a plural form as long as it is not specifically mentioned in a sentence. Furthermore, 'include/comprise' or 'including/comprising' used in the specification represents that one or more components, steps, operations, and elements exist or have been added.

FIG. 1 is a block diagram illustrating a semiconductor memory device 100 according to an embodiment.

Referring to FIG. 1, the semiconductor memory device 100 may include a memory cell array 110, an address decoder 120, a read and write circuit 130, a control logic 140 and a voltage generator 150.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read and write circuit 130 through bit lines BL1 to BLm. Each of the plurality of memory blocks BLK1 to BLKz may include a plurality of memory cells. According to the embodiment, the plurality of memory cells may be non-volatile memory cells. Memory cells coupled to the same word line, among the plurality of memory cells, may be defined as a single page. In other words, the memory cell array 110 may include a plurality of pages.

In addition, each of the memory blocks BLK1 to BLKz of the memory cell array 110 may include a plurality of cell strings. Each of the plurality of cell strings may include a drain selection transistor, a first memory cell group, a pipe transistor, a second memory cell group and a source selection transistor coupled in series between a bit line and a source line. The plurality of cell strings included in the memory cell array 110 are described below.

The address decoder 120, the read and write circuit 130 and the voltage generator 150 may operate as a peripheral circuit which drives the memory cell array 110.

The address decoder 120 may be coupled to the memory cell array 110 through the word lines WL. The address decoder 120 may be controlled by the control logic 140. The address decoder 120 may receive an address ADDR through an input/output buffer (not illustrated) in the semiconductor memory device 100.

The address decoder 120 may apply a read voltage Vread generated by the voltage generator 150 to a selected word line, among word lines of a selected memory block, during a read operation, and apply a program voltage generated by the voltage generator 150 to the selected word line, among the word lines of the selected memory block, during a program operation. The address decoder 120 may apply operating voltages, applied during the read operation, to the selected memory block, among the plurality of memory blocks sharing a single row decoder, and apply a discharge voltage to an unselected memory block to perform a discharge operation thereon, except for the selected memory block among the plurality of memory blocks. Thus, an increase in channel potential of a plurality of cell strings included in the unselected memory block may be prevented. Therefore, the width of the threshold voltage distribution of memory cells of the unselected memory block may be prevented from increasing by performing the read operation on the selected memory block.

In addition, the address decoder 120 may float word lines of the remaining unselected memory blocks, except for the selected memory block and the unselected memory block which share the row decoder with the selected memory block. For example, the address decoder 120 may float word lines coupled to the remaining memory blocks which do not share the row decoder, except for the unselected memory block which shares the row decoder.

The program and read operations of the semiconductor memory device 100 may be performed in units of pages. The address ADDR which is received in response to a request for the program and read operations may include a block address, a row address and a column address. The address decoder 120 may select a single memory block and a single word line in response to the block address and the row address. The address decoder 120 decodes the column address and provides a column selection signal Yi to the read and write circuit 130.

The read and write circuit 130 may include a plurality of page buffers PB1 to PBm. The page buffers PB1 to PBm may be coupled to the memory cell array 110 through the bit lines BL1 to BLm, respectively. Each of the page buffers PB1 to PBm may sense a program state of a corresponding memory cell and output the program state as read data during the read operation.

The read and write circuit 130 may be controlled by the control logic 140.

According to an embodiment, the read and write circuit 130 may include page buffers (or page registers) and a column selection circuit which operates in response to the column select signal Yi.

The control logic 140 may be coupled to the address decoder 120, the read and write circuit 130 and the voltage generator 150. The control logic 140 may receive a command CMD through the input/output buffer (not illustrated) of the semiconductor memory device 100. The control logic 140 may be configured to control the overall operation of the semiconductor memory device 100 in response to the command CMD. In addition, the control logic 140 may control the voltage generator 150 and the address decoder 120 to apply the discharge voltage to the unselected memory block sharing the row decoder with the selected memory block during the read operation of the memory cell array 110. More specifically, the control logic 140 may control the voltage generator 150 and the address decoder 120 to apply the discharge voltage to the unselected memory block, except for the selected memory block, among the memory blocks sharing the single row decoder for a preset time when the read operation is performed on the memory cell array 110. In other words, a channel potential of cell strings included in the unselected memory block may be discharged by applying the discharge voltage to word lines, a source selection line, a pipe line, and a drain selection line of the unselected memory block. A discharge operation may be performed by applying the discharge voltage to one of the drain selection line and the source selection line.

The voltage generator 150 may generate the read voltage Vread to be applied to the selected memory block and the discharge voltage to be applied to the unselected memory block sharing the row decoder with the selected memory block during the read operation. The discharge voltage may be a pass voltage, or a voltage having a potential greater than or equal to the pass voltage.

Figure 2:
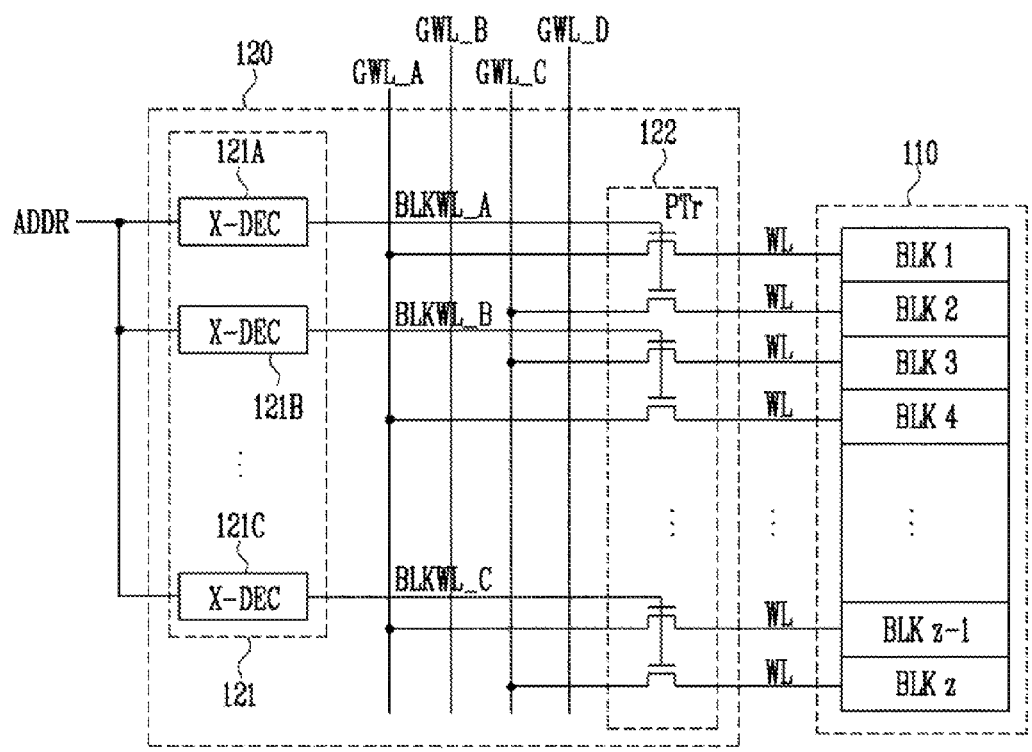
FIG. 2 is a detailed block diagram illustrating an address decoder shown in FIG. 1.

FIG. 2 is a detailed block diagram illustrating the address decoder 120 shown in FIG. 1.

Referring to FIG. 2, the address decoder 120 may include a row decoder unit 121 and a pass unit 122.

The row decoder unit 121 may include a plurality of row decoders 121A to 121C. Each of the plurality of row decoders 121A to 121C may correspond to the plurality of memory blocks BLK1 to BLKz. For example, a single row decoder, e.g., the row decoder 121A, may correspond to two memory blocks, e.g., the memory blocks BLK1 and BLK2. Although the description of this embodiment is made in reference to a structure in which two memory blocks correspond to a single row decoder, more than two memory blocks may be designed to correspond to a single row decoder.

The plurality of row decoders 121A to 121C may output block selection signals BLKWL_A to BLKWL_C, respectively, in response to the address ADDR. For example, the row decoder 121A may output the block selection signal BLKWL_A in response to the address ADDR, the row decoder 121B may output the block selection signal BLKWL_B in response to the address ADDR, and the row decoder 121C may output the block selection signal BLKWL_C in response to the address ADDR.

The pass unit 122 may include a plurality of pass transistors PTr. The plurality of pass transistors PTr may correspond to the plurality of memory blocks BLK1 to BLKz, respectively. In addition, the plurality of pass transistors PTr may electrically couple a plurality of global word line groups GWL_A to GWL_D to the word lines WL of the plurality of memory blocks BLK1 to BLKz in response to the block selection signals BLKWL_A to BLKWL_C. The pass transistors PTr corresponding to two memory blocks, e.g., the memory blocks BLK1 and BLK2, among the plurality of pass transistors PTr included in the pass unit 122, may be turned on or off in response to the block selection signal BLKWL_A output from the row decoder 121A. In addition, the pass transistors PTr corresponding to the memory blocks BLK3 and BLK4 may be turned on or off in response to the block selection signal BLKWL_B output from the row decoder 121B. The pass transistors PTr corresponding to the memory blocks BLKz−1 and BLKz may be turned on or off in response to the block selection signal BLKWL_C output from the row decoder 121C.

Figure 3:
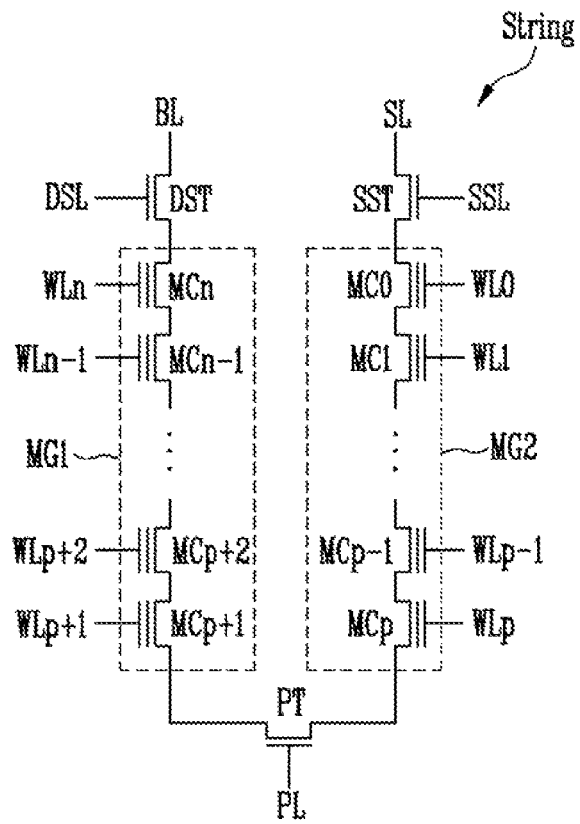
FIG. 3 is a circuit diagram illustrating a U-shaped cell string according to an embodiment.

FIG. 3 is a circuit diagram illustrating a U-shaped cell string String according to an embodiment.

Referring to FIG. 3, the U-shaped cell string String may include a drain selection transistor DST, a first memory cell group MG1, a pipe transistor PT, a second memory cell group MG2 and a source selection transistor SST, which are coupled in series between a bit line BL and a source line SL.

The first memory cell group MG1 may include p+1-th to n-th memory cells MCp+1 to MCn. The second memory cell group MG2 may include zeroth to p-th memory cells MC0 to MCp.

A gate of the drain selection transistor DST may be coupled to the drain selection line DSL, and a gate of the source selection transistor SST may be coupled to the source selection line SSL. The p+1-th to n-th memory cells MCp+1 to MCn of the first memory cell group MG1 may be coupled to word lines WLp+1 to WLn, respectively. The zeroth to p-th memory cells MC0 to MCp of the second memory cell group MG2 may be coupled to word lines WL0 to WLp, respectively. A gate of the pipe transistor PT may be coupled to the pipe line PL.

Figure 4:
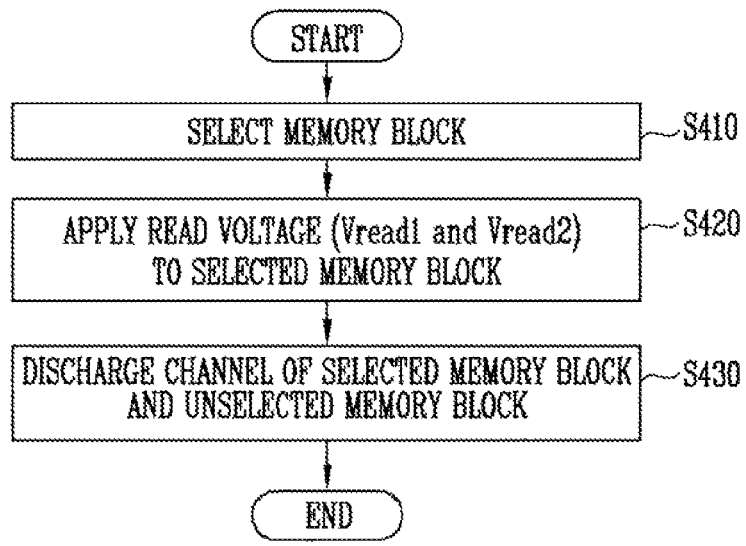
FIG. 4 is a flowchart illustrating an operating method of a semiconductor memory device according to an embodiment.
Figure 5:
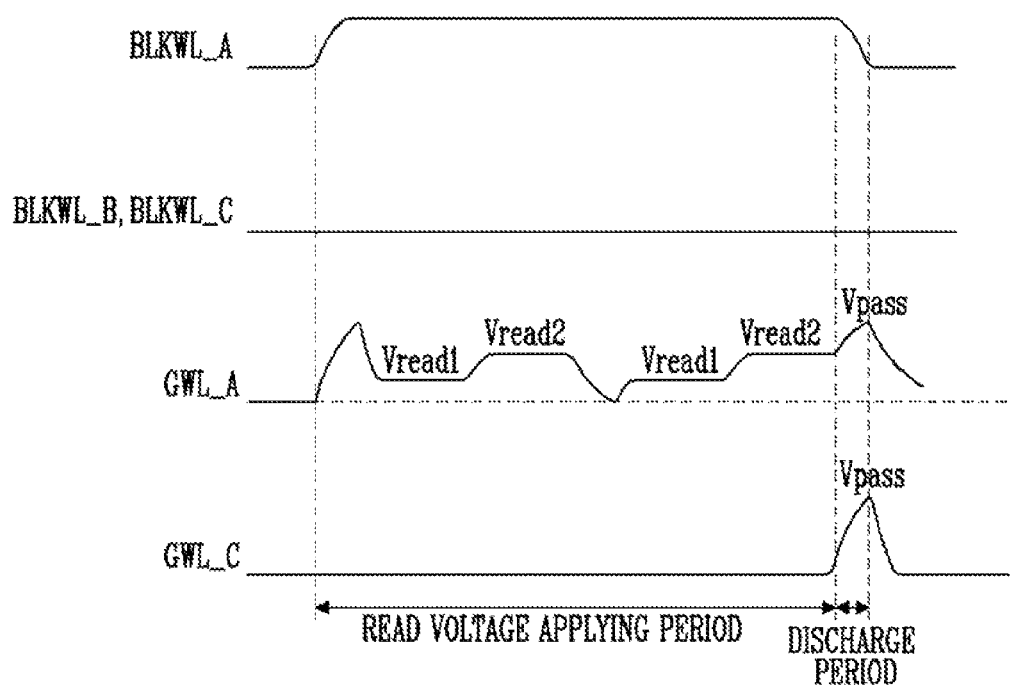
FIG. 5 is a waveform diagram illustrating an operation of a semiconductor memory device according to an embodiment.

FIG. 4 is a flowchart illustrating an operating method of a semiconductor memory device according to an embodiment, and FIG. 5 is a waveform diagram illustrating an operation of a semiconductor memory device according to an embodiment.

Hereinafter, an operation of the semiconductor memory device according to the embodiment is described with reference to FIGS. 1 to 5.

According to this embodiment, it is assumed that the memory block BLK1 is selected from among the plurality of memory blocks BLK1 to BLKz, and a read operation is performed on the selected memory block BLK1.

1) Select Memory Block (S410)

During a read operation, the address decoder 120 may select the memory block BLK1 among the memory blocks BLK1 to BLKz, to perform the read operation in response to the address ADDR which is input through the input/output buffer (not illustrated). More specifically, the row decoder 121A, among the plurality of row decoders 121A to 121C included in the row decoder unit 121, may output the block selection signal BLKWL_A having a high level in response to the address ADDR. The remaining row decoders 121B and 121C may output the block selection signals BLKWL_B to BLKWL_C having a low level in response to the address ADDR, respectively.

2) Apply Read Voltage to Selected Memory Block (S420)

The pass transistors PTr of the pass unit 122 corresponding to the row decoder 121A may be turned on in response to the block selection signal BLKWL_A having the high level during a read voltage applying period in which a read voltage is applied to the selected memory block BLK1. As a result, the word line of the selected memory block BLK1 may be coupled to the global word line group GWL_A, and the unselected memory block BLK2 corresponding to the row decoder 121A may be coupled to the global word line group GWL_C.

The voltage generator 150 may output a plurality of read voltages Vread1 and Vread2 and an operating voltage of 0V during the read voltage applying period. The generated read voltages Vread1 and Vread2 may be applied to the global word line group GWL_A. Therefore, the plurality of read voltages Vread1 and Vread2 may be applied to the word lines of the selected memory block BLK1 to perform the read operation thereon. The read voltages Vread1 and Vread2 may be applied to read high order bit data and low order bit data of a multi-level memory cell.

When the read voltages Vread1 and Vread2 are applied to the global word line group GWL_A, the operating voltage of 0V may be applied to the global word line group GWL_C.

The global word line groups GWL_B and GWL_D may be floated.

3) Discharge Channel of Selected Memory Block and Unselected Memory Block (S430)

The block selection signal BLKWL_A having a high level may be gradually discharged to a low level during a discharge period after the read voltage applying period is terminated.

The voltage generator 150 may output a pass voltage Vpass having a high level to the global word line group GWL_A and the global word line group GWL_C during the discharge period in which the block selection signal BLKWL_A is discharged from a high level to a low level. As a result, the pass voltage Vpass may be applied to word lines WL0 to WLn, the drain selection line DSL and the pipe line PL of each of the selected memory block BLK1 and the unselected memory block BLK2 sharing the row decoder 121A with the selected memory block BLK1, so that the memory cells MC0 to MCn, the drain selection transistor DST and the pipe transistor PT may be turned on to electrically couple the bit line BL to a channel. Therefore, electrons charged in the channel may be discharged through the bit line BL.

The pass voltage Vpass may be selectively applied to the source selection line SSL, so that electrons charged in the channel may be discharged to the source line SL or the bit line BL.

A channel potential of cell strings of the unselected memory block BLK2 sharing the same row decoder 121A with the selected memory block BLK1 may be increased by the read voltages Vread1 and Vread2 during the read voltage applying period, and be subsequently discharged by the pass voltage Vpass during the discharge period. Therefore, a threshold voltage distribution of memory cells of the unselected memory block BLK2 may remain unchanged.

Although the description of this embodiment is made in reference to a structure in which the pass voltage Vpass applied to the selected memory block BLK1 is substantially the same as the discharge voltage applied to the unselected memory block BLK2, the present invention is not limited thereto. For example, a voltage having a potential greater than or equal to the pass voltage Vpass applied to the selected memory block BLK1 may be used as a discharge voltage applied to the unselected memory block BLK2 while the pass voltage Vpass is applied to the selected memory block BLK1.

Figure 6:
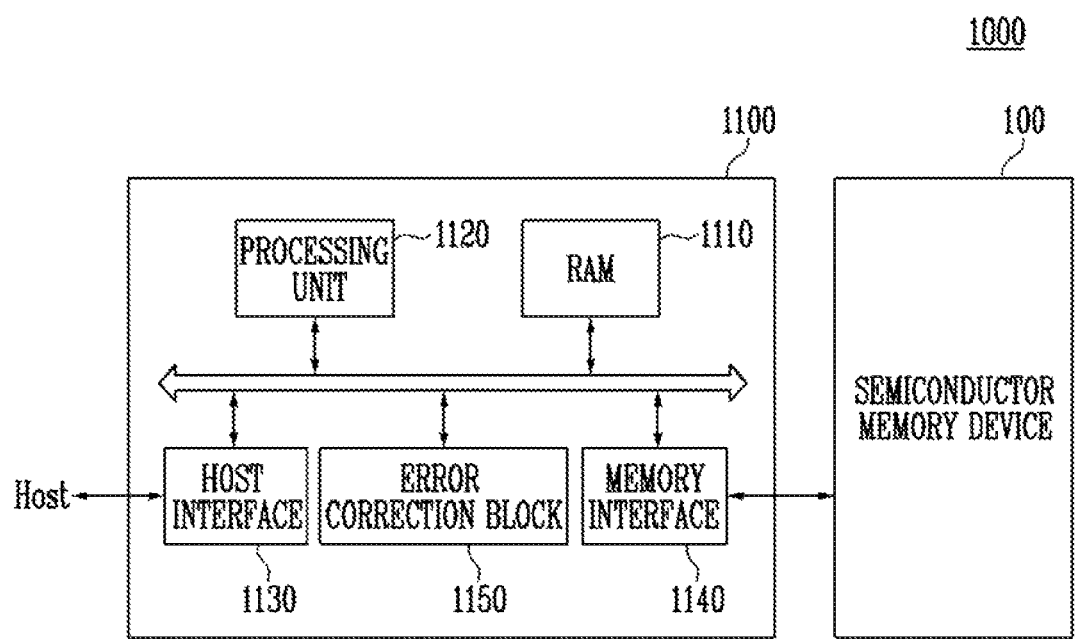
FIG. 6 is a block diagram illustrating a memory system including the semiconductor memory device shown in FIG. 1.

FIG. 6 is a block diagram illustrating a memory system 1000 including the semiconductor memory device shown in FIG. 1.

Referring to FIG. 6, the memory system 1000 may include the semiconductor memory device 100 and a controller 1100.

The semiconductor memory device 100 may be configured and operated in substantially the same manner as described above with reference to FIG. 1. Thus, a detailed description thereof will be omitted.

The controller 1100 may be coupled to a host and the semiconductor memory device 100. The controller 1100 may access the semiconductor memory device 100 in response to requests of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may be configured to drive firmware for controlling the semiconductor memory device 100.

The controller 1100 may include a random access memory (RAM) 1110, a processing unit 1120, a host interface 1130, a memory interface 1140 and an error correction block 1150.

The RAM 1110 may be used as at least one of operation memories of the processing unit 1120, a cache memory between the semiconductor memory device 100 and the host, and/or a buffer memory between the semiconductor memory device 100 and the host. The processing unit 1120 may control operations of the controller 1100. In addition, the controller 1100 may temporarily store program data provided from the host during a write operation.

The host interface 1130 may include a protocol for exchanging data between the host and the controller 1100. For example, the controller 1100 may communicate with the host through at least one of various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor memory device 100. For example, the memory interface may include a NAND flash interface or a NOR flash interface.

The error correction block 1150 may detect and correct errors in data read from the semiconductor memory device 100 based on an error correction code (ECC). For example, the error correction block 150 may be included in the controller 1100. The processing unit 1120 may control a read voltage in response to an error detection result of the error correction block 150 and control the semiconductor memory device 100 to perform a re-read operation.

The controller 1100 and the semiconductor memory device 100 may be integrated in one semiconductor device. For example, the controller 1100 and the semiconductor memory device 100 may be integrated in a single semiconductor device to form a memory card such as a personal computer memory card international association (PCM-CIA), a compact flash card (CF), a smart media card (SMC), a memory stick, a multimedia card (MMC), a reduced size MMC (RS-MMC), a micro-MMC, a secure digital (SD) card, a mini-SD, a micro-SD, an SDHC, a universal flash storage device (UFS), etc.

In another example, the controller 1100 and the semiconductor memory device 100 may be integrated as a solid state drive (SSD). The SSD may include a storage device for storing data in a semiconductor memory. When the memory system 1000 is used as an SSD, operational rates of the host coupled to the memory system 1000 may be significantly improved.

The memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

The semiconductor memory device 100 or the memory system 1000 may be packaged in various forms. For example, the semiconductor memory device 100 or the memory system 1000 may be packaged by various methods such as a package on package (PoP), a ball grid arrays (BGAs), a chip scale packages (CSPs), a plastic leaded chip carrier (PLCC), a plastic dual in line package (PDIP), a die in waffle pack (DWP), a die in wafer form (DWF), a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), etc.

Figure 7:
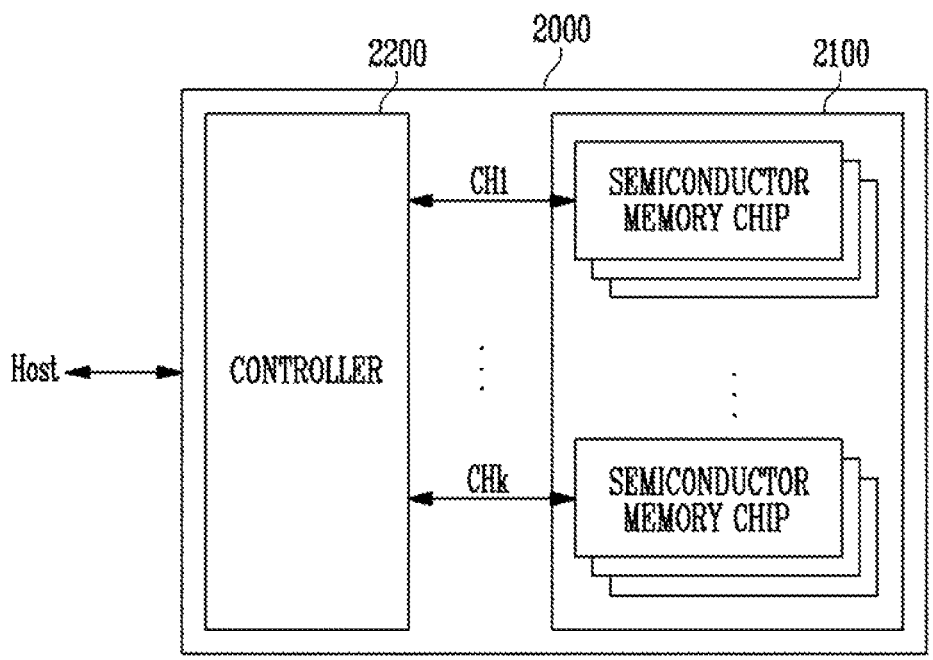
FIG. 7 is a block diagram illustrating an applied example of the memory system shown in FIG. 6.

FIG. 7 is a block diagram illustrating an applied example of the memory system shown in FIG. 6.

Referring to FIG. 7, a memory system 2000 may include a semiconductor memory device 2100 and a controller 2200. The semiconductor memory device 2100 may include semiconductor memory chips. The semiconductor memory chips may be divided into groups.

FIG. 7 illustrates that each of the groups in the semiconductor memory chips communicates with the controller 2200 through respective first to k-th channels CH1 to CHk. Each of the semiconductor memory chips may be configured and operated in substantially the same manner as the semiconductor memory device 100 described above with reference to FIG. 1.

Each of the groups in the semiconductor memory chips may communicate with the controller 2200 through a single common channel. The controller 2200 may be configured in substantially the same manner as the controller 1200 described with reference to FIG. 6, and configured to control the plurality of memory chips of the semiconductor memory device 2100.

Figure 8:
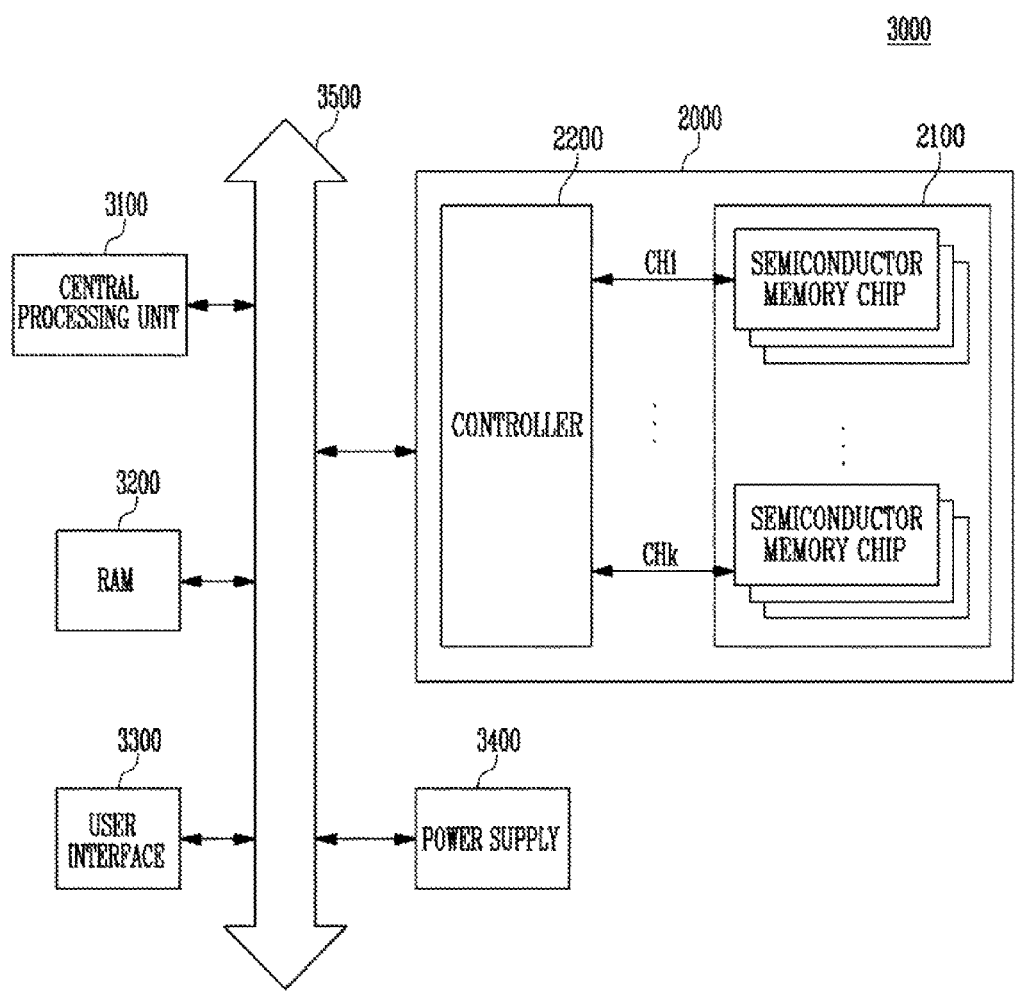
FIG. 8 is a block diagram illustrating a computing system including the memory system shown in FIG. 7.

FIG. 8 is a block diagram illustrating a computing system 3000 having the memory system 2000 shown in FIG. 7.

Referring to FIG. 8, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 8, the semiconductor memory device 2100 may be coupled to the system bus 3500 through the controller 2200. In some embodiments, the semiconductor memory device 2100 may be directly coupled to the system bus 3500. The central processing unit 3100 and the RAM 3200 may perform functions of the controller 2200.

As illustrated in FIG. 8, the memory system 2000 shown in FIG. 7 may be included in the computing system 3000. However, in some embodiments, the memory system 2000 may be replaced with the memory system 1000 shown in FIG. 6. In some embodiments, the computing system 3000 may include both the memory systems 1000 and 2000 described above with reference to FIGS. 6 and 7, respectively.

According to embodiments of the present invention, since a discharge voltage is applied to an unselected memory block between at least two memory blocks sharing a single row decoder after an operation of applying a read voltage to a selected memory block is completed, a channel potential of the unselected memory block may be discharged. Accordingly, a threshold voltage of the unselected memory block may be prevented from being changed to improve its threshold voltage distribution.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device comprising:
   at least two memory blocks suitable for sharing a row decoder; and
   a peripheral circuit suitable for performing a read operation on a selected memory block of the at least two memory blocks,
   wherein the peripheral circuit applies a discharge voltage to an unselected memory block of the at least two memory blocks for a preset time after a period in which a read voltage is applied to the selected memory block is terminated, and
   wherein the at least two memory blocks are coupled to different global word line groups in response to a block selection signal output from the row decoder.

2. The semiconductor memory device of claim 1, wherein the peripheral circuit applies the discharge voltage to a plurality of word lines and a drain selection line of the unselected memory block and electrically couples a channel to a bit line of the unselected memory block.

3. The semiconductor memory device of claim 1, wherein the peripheral circuit applies a pass voltage to the selected memory block when applying the discharge voltage to the unselected memory block.

4. The semiconductor memory device of claim 3, wherein the discharge voltage has a potential greater than or equal to a potential of the pass voltage.

5. The semiconductor memory device of claim 1, wherein the peripheral circuit electrically couples a channel to a source line of the unselected memory block by applying the discharge voltage to a plurality of word lines and a source selection line of the unselected memory block.

6. A semiconductor memory device comprising:
   an address decoder including a plurality of row decoders;
   at least two memory blocks corresponding to one of the plurality of row decoders; and
   a voltage generator suitable for generating and outputting a read voltage, a pass voltage and a discharge voltage to the address decoder,
   wherein the address decoder applies the read voltage to a selected memory block of the at least two memory blocks, and applies the discharge voltage to the unselected memory block during a read operation, and
   wherein the at least two memory blocks are coupled to different global word line groups in response to a block selection signal output from the row decoder.

7. The semiconductor memory device of claim 6, wherein the address decoder includes:
   a row decoder unit suitable for outputting a plurality of block selection signals in response to an address; and
   a pass unit suitable for electrically coupling global word line groups to word lines of the at least two memory blocks in response to the plurality of block selection signals.

8. The semiconductor memory device of claim 7, wherein the row decoder unit includes a plurality of row decoders, each of which outputs a corresponding one of the block selection signals in response to the address, and corresponds to the at least two memory blocks.

9. The semiconductor memory device of claim 6, wherein the address decoder electrically couples a channel of cell strings to a bit line included in the unselected memory block by applying the discharge voltage to a plurality of word lines and a drain selection line of the unselected memory block.

10. The semiconductor memory device of claim 6, wherein the address decoder applies the pass voltage to the selected memory block when the discharge voltage is applied to the unselected memory block.

11. The semiconductor memory device of claim 6, wherein the address decoder electrically couples a channel of cell strings to a source line included in the unselected memory block by applying the discharge voltage to a plurality of word lines and a source selection line of the unselected memory block.

12. The semiconductor memory device of claim 6, wherein the discharge voltage has a potential greater than or equal to a potential of the pass voltage.

13. An operating method of a semiconductor memory device including at least two memory blocks sharing a row decoder, the operating method comprising:
   applying a read voltage to a selected memory block of the at least two memory blocks, and applying a discharge voltage to an unselected memory block after applying the read voltage to the selected memory block, wherein the at least two memory blocks are coupled to different global word line groups in response to a block selection signal output from the row decoder.

14. The operating method of claim 13, further comprising:
applying a pass voltage to the selected memory block when applying the discharge voltage to the unselected memory block.

15. The operating method of claim 14, wherein the discharge voltage has a potential greater than or equal to a potential of the pass voltage.

16. The operating method of claim 13, wherein the discharge voltage is applied to a plurality of word lines and a drain selection line of the unselected memory block so that a channel of a cell string and a bit line included in the unselected memory block are electrically coupled to each other.

17. The operating method of claim 13, wherein the discharge voltage is applied to a plurality of word lines and a source selection line of the unselected memory block so that a channel of a cell string and a source line included in the unselected memory block are electrically coupled to each other.

* * * * *